United States Patent
Arell

(10) Patent No.: US 10,291,190 B2
(45) Date of Patent: May 14, 2019

(54) CASCODE POWER AMPLIFIER STAGE USING HBT AND FET

(71) Applicant: Skyworks Solutions, Inc., Woburn, MA (US)

(72) Inventor: Thomas William Arell, Basking Ridge, NJ (US)

(73) Assignee: Skyworks Solutions, Inc., Woburn, MA (US)

(*) Notice: Subject to any disclaimer, the term of this patent is extended or adjusted under 35 U.S.C. 154(b) by 0 days.

(21) Appl. No.: 15/699,521

(22) Filed: Sep. 8, 2017

(65) Prior Publication Data

US 2018/0138873 A1 May 17, 2018

Related U.S. Application Data

(63) Continuation of application No. 14/957,023, filed on Dec. 2, 2015, now Pat. No. 9,768,744.

(60) Provisional application No. 62/087,157, filed on Dec. 3, 2014.

(51) Int. Cl.
| | |
|---|---|
| *H03F 3/19* | (2006.01) |
| *H03F 3/193* | (2006.01) |
| *H03F 1/42* | (2006.01) |
| *H03F 1/02* | (2006.01) |
| *H03F 1/22* | (2006.01) |

(52) U.S. Cl.
CPC ............ *H03F 3/193* (2013.01); *H03F 1/0205* (2013.01); *H03F 1/223* (2013.01); *H03F 1/226* (2013.01); *H03F 1/42* (2013.01); *H03F 3/1935* (2013.01); *H03F 2200/451* (2013.01)

(58) Field of Classification Search
CPC ....................................................... H03F 3/193
See application file for complete search history.

(56) References Cited

U.S. PATENT DOCUMENTS

| | | | | |
|---|---|---|---|---|
| 4,754,233 A | * | 6/1988 | Pickett | H03G 3/3052 330/285 |
| 5,587,687 A | * | 12/1996 | Adams | H03F 3/45089 327/359 |
| 5,742,902 A | * | 4/1998 | Shore | G07C 9/00182 340/12.5 |
| 7,015,519 B2 | | 3/2006 | Krutko et al. | |
| 9,369,087 B2 | * | 6/2016 | Burgener | H01Q 23/00 |
| 2011/0279184 A1 | * | 11/2011 | Chan | H03F 1/223 330/295 |

(Continued)

OTHER PUBLICATIONS

U.S. Appl. No. 14/957,023, filed Dec. 2, 2015, Arell.
F. Ali et al., HEMTs & HBTs: Devices, Fabrication, and Circuts (Artech House, 1991).

*Primary Examiner* — Patricia T Nguyen
(74) *Attorney, Agent, or Firm* — Knobbe, Martens, Olson & Bear, LLP

(57) ABSTRACT

A power amplifier comprising a bipolar transistor connected in cascode with a field effect transistor (FET) such as a pseudomorphic high electron mobility transistor (PHEMT) device. The bipolar transistor has a common emitter and the FET a common gate. Advantageously, the bipolar transistor is a heterojunction bipolar transistor (HBT); and the HBT and the FET may be integrated on a single die. Illustrative materials for the HBT and FET are Gallium Nitride, Indium Phosphide, or Gallium Arsenide/Indium Gallium Phosphide.

20 Claims, 2 Drawing Sheets

(56) References Cited

U.S. PATENT DOCUMENTS

| | | | |
|---|---|---|---|
| 2015/0115289 A1* | 4/2015 | Fursin | H01L 29/7395 |
| | | | 257/77 |
| 2017/0359038 A1* | 12/2017 | Tanaka | H03F 1/0205 |
| 2018/0054171 A1* | 2/2018 | Pehlivanoglu | H03F 3/181 |

* cited by examiner

CASCODE POWER AMPLIFIER STAGE USING HBT AND FET

CROSS REFERENCE TO RELATED APPLICATION

This application is a continuation of U.S. application Ser. No. 14/957,023, filed on Dec. 2, 2015 and titled "CASCODE POWER AMPLIFIER STAGE USING HBT AND FET", which is hereby incorporated by reference in its entirety herein and which claims benefit of provisional application Ser. No. 62/087,157, filed Dec. 3, 2014, which application is incorporated by reference herein in its entirety.

BACKGROUND

The use of GaAs InGaP heterojunction bipolar transistor (HBT) devices for RF power amplifiers above 2.5 GHz becomes more challenging due to the lower input impedance of the common emitter stage as well as lower gain. The use of field effect transistor (FET) devices such as high electron mobility transistor (HEMT) and pseudomorphic high electron mobility transistor (PHEMT) devices at higher frequencies is common due to the higher gain and ease of impedance matching. However the FET device needs a relatively high quiescent current compared to the HBT when operated in class AB mode. Depletion mode PHEMT are normally on devices and also require a negative gate voltage with power supply sequencing to prevent damage. HBT devices are also susceptible to overdrive conditions that will cause failure at higher current densities.

SUMMARY

The use of a cascode configuration with a common emitter HBT followed by a common gate FET solves these problems. The turnoff and negative voltage problem is gone since the HBT controls the current. The quiescent current in class AB bias and the current versus power behavior of the cascode is essentially that of the HBT. Also the FET device will limit the current and limit the HBT current density to safe levels. The cascode will also have higher gain and bandwidth than either the HBT or FET due to the reduced Miller capacitance provided by the low impedance of the common gate input. This also results in a higher impedance at the input of the HBT. Use of the FET in the cascode also allows for utilization of higher supply voltage since the overall breakdown voltage of the cascode would be the sum of the two devices.

Advantageously, the HBT and the FET may be integrated on a single die, a feature that becomes more important at the higher frequencies. Alternatively a silicon bipolar transistor can be used in place of the HBT.

BRIEF DESCRIPTION OF DRAWING

These and other objects, features and advantages of the invention will be more readily apparent from the following detailed description in which.

DETAILED DESCRIPTION

Figure 1:
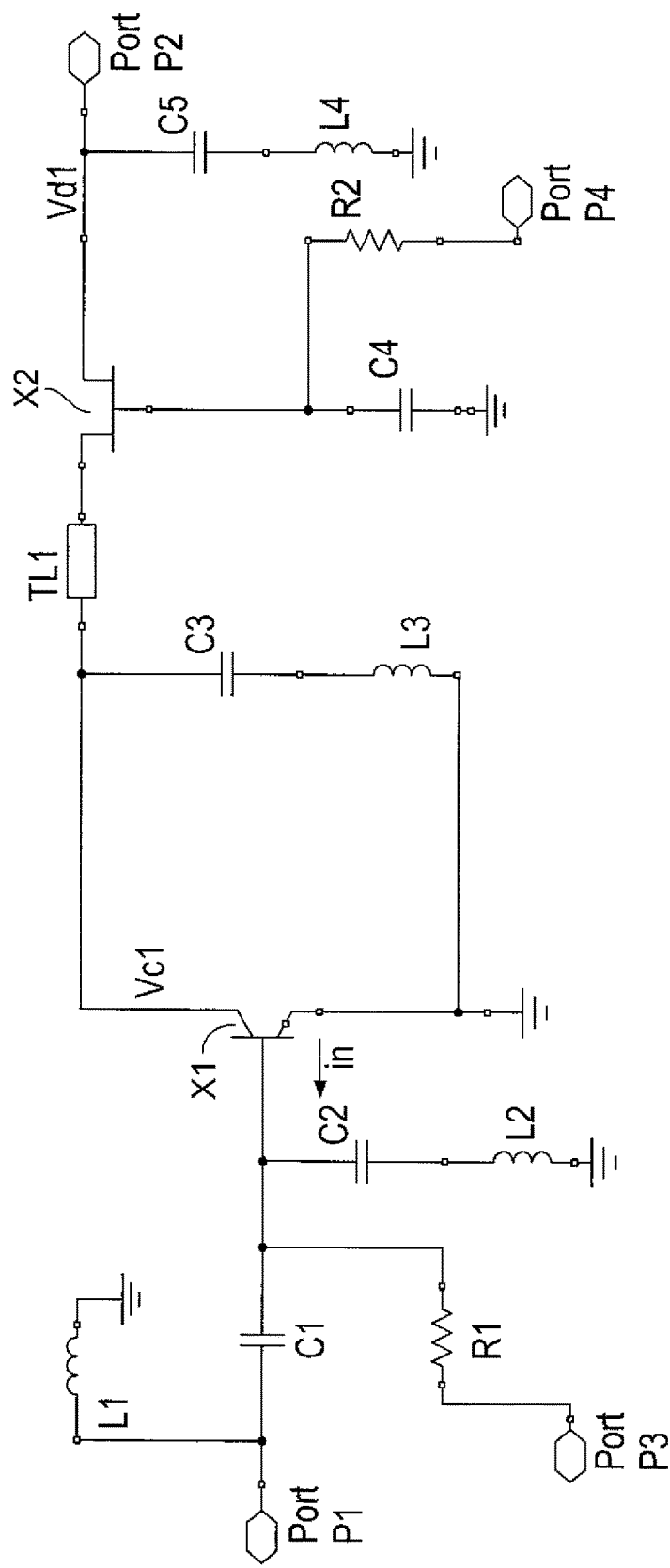
FIG. 1 is a schematic diagram depicting a first illustrative embodiment of the present invention.

FIG. 1 is a schematic diagram depicting an illustrative embodiment of a HBT-FET cascode such as might be used at 5.5 GHz with a supply voltage of 15 Volts. In this example, L1 and C1 form an input impedance matching network. R1 is the base resistance/ballast feed. X1 is an HBT common emitter device. C3 and L3 provide a second harmonic trap. C2 and L2 and C5 and L4 provide additional harmonic traps. TL1 is a small inductance for band shaping and stability. X2 is a PHEMT common gate device. C4 is RF by pass for the gate. R2 is the gate bias injection for the PHEMT device. The output load was set at 120 Ohms and the source impedance is 50 Ohms.

Other types of FET devices may be substituted for the PHEMT in the cascode of FIG. 1. These include any type of HEMT device and any type of metal-semiconductor field effect transistor (MESFET) device.

Illustratively, the HBT and FET devices are formed in a III-V semiconductor material such as Gallium Nitride, Indium Phosphide, or Gallium Arsenide/Indium Gallium Phosphide. In some applications, it may be advantageous to integrate the HBT and the FET device in a single semiconductor crystal by epitaxially growing the HBT device on an epitaxially grown FET device. Such a device and the process for making it in a GaAs/InGaP epitaxial growth process is described in U.S. Pat. No. 7,015,519, which is incorporated herein by reference. Other materials may also be used. For example Silicon Germanium (SiGe) may be used as the HBT. Alternatively a common emitter Silicon bipolar transistor may be used in place of the HBT.

Figure 2:
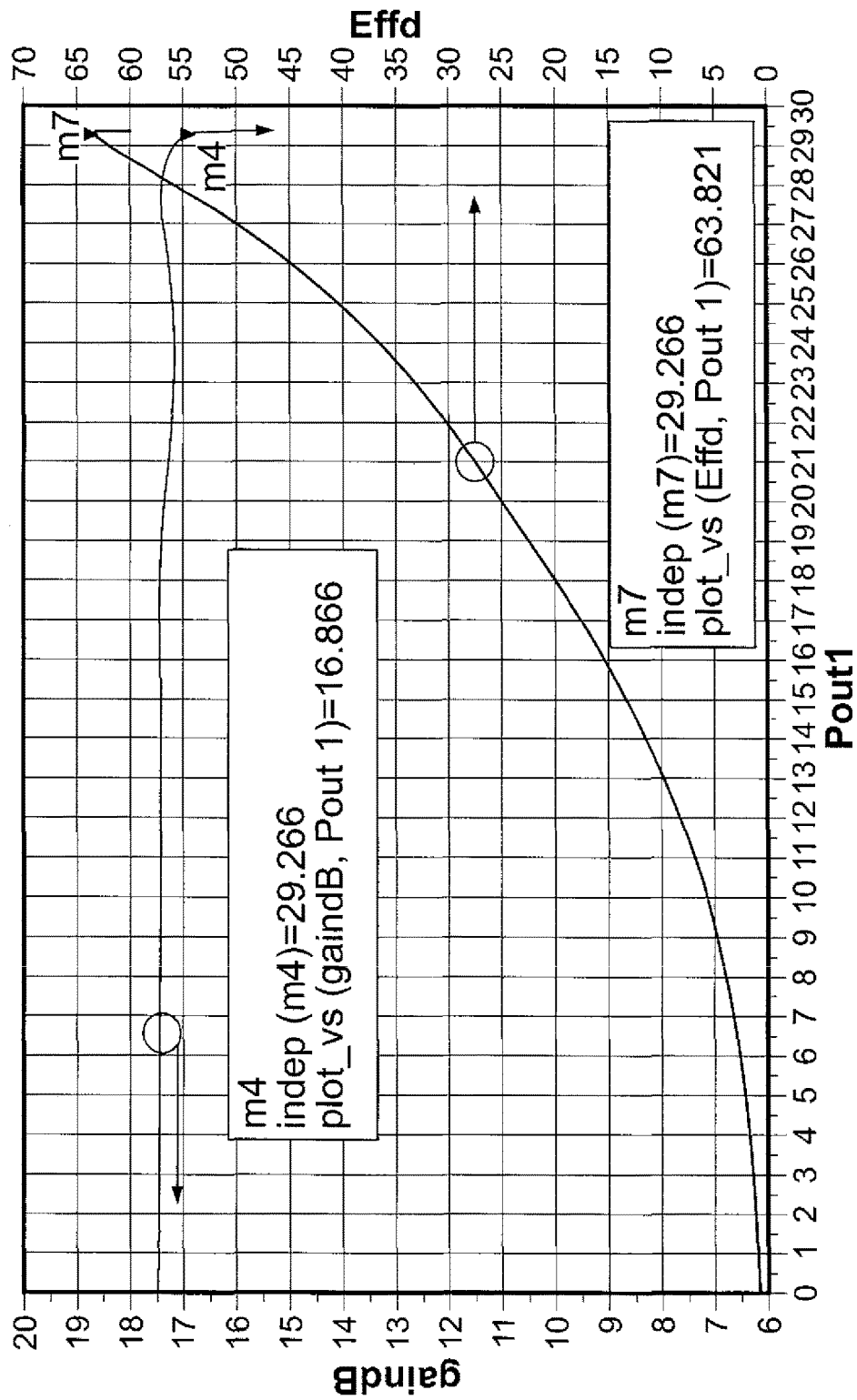
FIG. 2 is a plot depicting gain in dB (on the left-hand vertical axis) and efficiency (on the right-hand vertical axis) versus output power in dBm (on the horizontal axis) for a simulation of a cascode circuit such as that of FIG. 1.

FIG. 2 is a plot depicting gain in dB (on the left-hand vertical axis) and efficiency (on the right-hand vertical axis) versus output power in dBm (on the horizontal axis) for a simulation of a cascode circuit such as that of FIG. 1.

As will be apparent to those skilled in the art, numerous variations may be practiced within the spirit and scope of the present invention. Further details concerning HBT and HEMT devices may be found in F. Ali et al., *HEMTs & HBTs: Devices, Fabrication, and Circuits* (Artech House, 1991) which is incorporated by reference herein.

What is claimed is:

1. A power amplifier comprising:
   a first transistor of a first type;
   a second transistor of a second type connected in a cascode configuration with the first transistor;
   a harmonic trap connected between the first transistor and the second transistor, the harmonic trap including at least a capacitor and an inductor; and
   a band shaping inductor connected between the first transistor and the second transistor, the band shaping inductor differing from the inductor of the harmonic trap.

2. The power amplifier of claim 1 wherein the first transistor and the second transistor are formed using a III-V semiconductor material.

3. The power amplifier of claim 1 wherein the first transistor and the second transistor are integrated in a single semiconductor crystal.

4. The power amplifier of claim 1 wherein the first transistor is epitaxially grown on a device of the second type.

5. The power amplifier of claim 1 further comprising an impedance matching network connected to a base of the first transistor.

6. The power amplifier of claim 1 further comprising one or more additional harmonic traps connected to a base of the first transistor.

7. The power amplifier of claim 1 further comprising at least one additional harmonic trap connected to a drain of the second transistor.

8. The power amplifier of claim 1 wherein the first transistor is a heterojunction bipolar transistor.

9. The power amplifier of claim 1 wherein the second transistor is a high electron mobility transistor.

10. The power amplifier of claim 9 wherein the second transistor is a pseudomorphic high electron mobility transistor.

11. The power amplifier of claim 1 wherein the second transistor is a metal-semiconductor field effect transistor.

12. The power amplifier of claim 1 further comprising a radio frequency bypass capacitor connected to a gate of the second transistor.

13. The power amplifier of claim 1 further comprising a gate bias injection resistor connected to a date of the second transistor.

14. The power amplifier of claim 1 wherein the first transistor is a common emitter device and the second transistor is a common gate device.

15. The power amplifier of claim 1 further comprising a ballast feed resistor connected to a base of the first transistor.

16. The power amplifier of claim 1 wherein the first transistor and the second transistor are integrated on a single die formed using an epitaxial growth process.

17. A semiconductor die comprising:
a power amplifier including a first transistor of a first type integrated in the semiconductor die, a second transistor of a second type integrated within the semiconductor die, a harmonic trap including at least a capacitor and an inductor, and connected between the first transistor and the second transistor, the second transistor connected in a cascode configuration with the first transistor, and a band shaping inductor connected between the first transistor and the second transistor, the band shaping inductor differing from the inductor of the harmonic trap.

18. A power amplifier comprising:
a bipolar transistor; and
a field effect transistor connected in a cascode configuration with the bipolar transistor, the bipolar transistor controlling a current of the power amplifier, the field effect transistor limiting a current density of the bipolar transistor, and the overall breakdown voltage of the cascode configuration equaling the sum of a breakdown voltage of the bipolar transistor and a breakdown voltage of the field effect transistor.

19. The power amplifier of claim 18 wherein the bipolar and field effect transistors are integrated on a single die.

20. The semiconductor die of claim 17 wherein the first transistor and the second transistor are integrated on the semiconductor die using an epitaxial growth process.

* * * * *